United States Patent [19]
Davies

[11] 4,021,701
[45] May 3, 1977

[54] TRANSISTOR PROTECTION CIRCUIT

[75] Inventor: Robert Bruce Davies, Tempe, Ariz.

[73] Assignee: Motorola, Inc., Chicago, Ill.

[22] Filed: Dec. 8, 1975

[21] Appl. No.: 638,879

[52] U.S. Cl. .............................. 361/18; 330/207 P; 361/103
[51] Int. Cl.² ........................................ H02H 7/20
[58] Field of Search ............ 317/33 R, 33 VR, 31, 317/16, 40; 307/202 R, 237, 300; 330/207 P; 323/9, 22 T

[56] References Cited
UNITED STATES PATENTS

| | | | |
|---|---|---|---|
| 3,527,997 | 9/1970 | Nercessian | 317/33 VR X |
| 3,571,660 | 3/1971 | Phillips | 317/16 |
| 3,577,035 | 5/1971 | Constable | 317/31 |
| 3,597,655 | 8/1971 | Forte | 317/33 VR X |
| 3,755,751 | 8/1973 | Ring | 330/207 P X |
| 3,845,405 | 10/1974 | Leidich | 330/207 P |
| 3,896,393 | 7/1975 | Cave et al. | 330/207 P X |
| 3,906,310 | 9/1975 | Esashika | 317/33 VR |
| 3,916,263 | 10/1975 | Abbott | 317/31 X |

Primary Examiner—Miller. J. D.
Assistant Examiner—Patrick R. Salce
Attorney, Agent, or Firm—Maurice J. Jones, Jr.

[57] ABSTRACT

The disclosed protection circuit which is suitable for providing protection of transistors included in integrated circuits such as regulators and power amplifiers, includes thermal shutdown, safe area and current control circuits. The current control portion includes a sense transistor connected substantially in parallel with the transistor to be protected. In monolithic integrated circuit applications, the sense transistor has an emitter area that is a predetermined ratio of the emitter area of the protected transistor. A "sense resistor" is connected to the sense transistor and develops a control signal which is proportional to the instantaneous current being conducted by the protected transistor. A threshold circuit is coupled between the sense resistor and the drive circuit for the protected transistor and responds to the magnitude of the control signal crossing a predetermined threshold to remove or reduce the drive to the protected transistor.

10 Claims, 3 Drawing Figures

TRANSISTOR PROTECTION CIRCUIT

BACKGROUND OF THE INVENTION

It is often necessary that modern solid state equipment include protection circuitry for preventing the destruction of transistors in the event that either the temperature of the protected transistor exceeds a predetermined maximum value, the current magnitude of the protected transistor increases above a maximum value or the voltages and currents of the protected transistor approach the limits of the "safe area." More specifically, present day solid state voltage regulators, current regulators and audio power amplifiers often include a "series" sense resistor connected in series between a protected transistor and the output terminal of the circuit. Threshold sensitive circuitry is coupled between the sense resistor and the driving circuitry of the protected transistor. When the voltage across the sense resistor reaches a predetermined magnitude, the threshold circuit is rendered operative and reduces the base drive to the output transistor so that the current thereof is reduced before the protected transistor is damaged. This protection scheme has been employed both in discrete and integrated circuits.

The foregoing prior art current controlling circuit has several disadvantages. More specifically, in integrated circuit applications the sense resistor is usually fabricated either near to or as part of the protected transistor. Such series sense resistor usually conducts the entire output current. Since the sense resistor constantly creates heat, the protected transistor is made larger than it otherwise would have to be so that it can dissipate the heat transferred thereto from the sense resistor. Moreover, the protected transistor is made larger to provide the necessary drive power for the series sense resistor which forms part of the load thereof. The resulting increase in die surface area of the protected transistors, which are likely to be the largest components of the chip, results in increased cost, particularly in monolithic integrated circuits utilizing this technique. The increase in die area also results in decreased reliability.

Voltage regulators are often required to have no more than a maximum input-output differential voltage characteristic as a function of output current and temperature. Hence, it is desired that the differential input-output voltage be as small as possible. Since the series sense resistor of prior art current control circuits is connected in the series path between the input terminal and the output terminal, the sense voltage thereacross undesirably increases the input-to-output differential voltage. Thus, voltage regulators which would meet a test specification if the series sense resistor was not included therein are often rejected beacuse of the undesired differential input-to-output voltage generated by the series sense resistor.

SUMMARY OF THE INVENTION

An object of the invention is to provide an improved protection circuit.

Another object of the invention is to provide a circuit for controlling the circuit in a protected transistor, which does not require a resistor to be connected in series between the protected transistor and the output terminal of the circuit including the protected transistor.

Still another object of the invention is to provide an improved protection circuit which reduces the power dissipation requirements of a protected transistor as compared to protection circuits requiring a resistor to be connected in series between the protected transistor and the output terminal of the circuit including the protected transistor.

A still further object is to provide current control circuit which does not increase the differential input-to-output voltage of the regulator.

An additional object is to provide a current control circuit which is suitable for sharing components with thermal and safe area protection circuits and which enables the output voltage of the regulator to be reduced below one volt when the protective circuitry causes the regulator to operate in a non-regulating mode.

Another object is to provide a current control circuit which is suitable for being provided in monolithic integrated circuit form for a power transistor included in the integrated circuit.

Briefly, the invention relates to a protection circuit for a protected transistor having an output electrode directly connected to a load rather than being connected to the load through a series sense resistor. The protection circuit includes a sense transistor having emitter and base electrodes respectively connected to the emitter and base electrodes of the protected transistor so that the sense transistor conducts a current having a magnitude proportional to the instantaneous magnitude of the current conducted by the output transistor. A current responsive circuit having a well-defined threshold is connected between the sense transistor and a control electrode of the protected transistor. The threshold circuit is responsive to the magnitude of the current of the sense transistor increasing above a predetermined magnitude to reduce the base drive of the protected transistor and thereby limit the current through the protected transistor. Accordingly, the magnitude of the current in the protected transistor is prevented from exceeding a predetermined value so that the protected transistor is not damaged by excessive current.

DETAILED DESCRIPTION OF THE PREFERRED EMBODIMENTS

Figure 1:
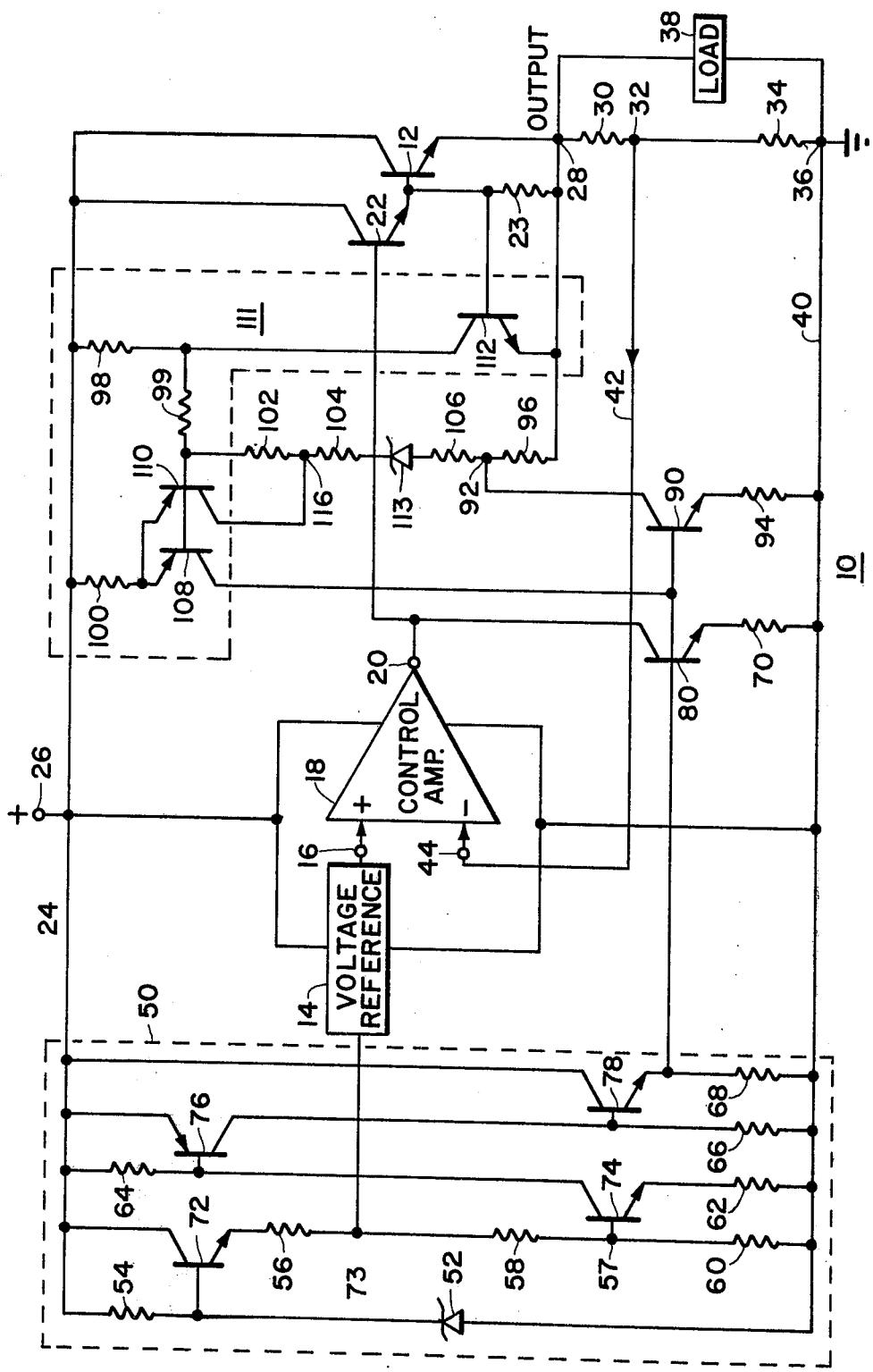
FIG. 1 is a block and schematic diagram of a voltage regulator including a protection circuit of one embodiment of the invention.

FIG. 1 is a diagram of an integrated circuit 10 including a voltage regulator having a series pass output transistor 12 which is protected by the protection circuit of one embodiment of the invention. Voltage reference 14 circuit is connected to the noninverting input terminal 16 of control amplifier 18. Voltage reference circuit 14 and control amplifier 18 are shown in block form in FIG. 1 and can have circuit configurations known in the art. Output terminal 20 of control amplifier 18 is connected to the base electrode of driver transistor 22. The emitter electrode of emitter follower transistor 22 is connected to the base electrode of output transistor 12 and to load resistor 23. The collector electrodes of transistors 12 and 22 are connected to positive power supply conductor 24 which is connected through pin out terminal 26 to a supply of positive potential. The emitter electrode of output transistor 12 is directly connected to output pinout terminal 28. Resistor 30 which may be provided in discrete form is connected between output terminal 28 and control pin out terminal 32. Resistor 34, which also may be provided in discrete form in combination with resistor 30 forms a voltage divider that is connected between output pinout terminal 28 and ground pinout 36. Load 38 can be connected between output terminal 28 and ground pinout 36. Negative power supply conductor 40 is also connected to pinout 36. Conductors 24 and 40 are connected to voltage reference circuit 14 and control amplifier 18. A feedback path including conductor 42 connects control pinout terminal 32 to inverting or negative input terminal 44 of control amplifier 18. The voltage regulator includes voltage reference 14, control amplifier 16, transistors 12, 22 and resistors 30, 34.

The thermal shutdown circuit in dashed block 50 provides start up for the voltage regulator and includes zener diode 52, resistors 54, 56, 58, 60, 62, 64, 66 and 68, and transistors 72, 74, 76, and 78. When a voltage is initially applied between conductors 40 and 24, resistor 54 provides current to the base electrode of transistor 72 and to the cathode of zener diode 52. Consequently, transistor 72 is rendered conductive and provides current to the series circuit including resistors 56, 58 and 60 which are connected between the emitter electrode of transistor 72 and conductor 40. The voltage at junction 73 of resistors 56 and 58 energizes voltage reference circuit 14 which provides a voltage of a regulated, predetermined magnitude to terminal 16 of control amplifier 18. Control amplifier 18 provides base drive for emitter follower driver transistor 22 which develops a voltage across load resistor 23. Consequently, series pass transistor 12 is rendered conductive in response to the current conducted by transistor 22 and the voltage across resistor 23. As a result, current flows from power supply conductor 24 through the collector and emitter electrodes of series pass transistor 12, output terminal 28 and a first parallel path including resistors 30 and 34 and a second parallel path including electrical load 38 to the ground potential applied to terminal 36.

Thus, a voltage is developed at control terminal 32 which is representative of and varies with the output voltage across load 38. The resistances of resistors 30 and 34, are selected such that if the magnitude of the output voltage at output terminal 28 becomes undesirably large, a signal is fed back through conductor 42 to inverting terminal 44 of amplifier 18 which then reduces the voltage and current levels provided to driver transistor 22. Consequently, transistor 12 is then rendered less conductive and the undesirably large magnitude of the voltage at output terminal 28 decreases.

Alternatively, if the magnitude of the regulated voltage at output terminal 28 becomes undesirably small then the negative feedback control signal developed at node 32 will likewise be reduced in magnitude and consequently control amplifier 18 will provide more voltage and current to driver transistor 22. As a result, series pass transistor 12 will then be rendered more conductive so that the current through the load and through the voltage divider including resistors 30 and 34 is increased to result in an increase in the undesirably small output voltage magnitude developed at voltage regulator output terminal 28.

The protection circuitry of integrated circuit 10 includes thermal shutdown, safe area and short circuit protection. The operation of thermal protection circuit 50 will next be described. NPN transistors 74, 78 and 80, and PNP transistor 76 are normally non-conductive during operation. As the temperature of integrated circuit 10 increases, the magnitude of the voltage developed across zener diode 52, which is selected to have predetermined positive temperature coefficient, increases. Alternatively, since the base-to-emitter turn on threshold voltage for transistor 74 has a negative temperature coefficient, as the temperature increases the threshold voltage for transistor 74 decreases. Therefore, before the temperature of integrated circuit 10 increases to an undesirable level a crossover point is reached whereat the increasing voltage developed at node 57, as a result of the increasing voltage of zener diode 52, exceeds the decreasing threshold voltage of transistor 74. Consequently, transistor 74 which has a base electrode connected to node 57 is rendered conductive and draws current through resistor 64. As a result transistor 76, which has a base electrode connected to the collector of transistor 74 and to resistor 64, is rendered conductive and supplies more current through resistor 66. Consequently, transistor 78 which includes a base electrode connected to resistor 66 is likewise rendered conductive and supplies current through its emitter electrode and through resistor 68. Consequently, the voltage across resistor 68, which is connected to the base electrode of control transistor 80, causes transistor 80 to conduct and shunt the drive current normally provided by control amplifier 18 away from the base electrode of driver transistor 22. Consequently, driver transistor 22 and series pass output transistor 12 are caused to be nonconductive until the temperature of integrated circuit 10 is reduced to where the voltage created at control node 57 is less than the threshold turnon voltage of transistor 74. Then transistors 74, 76 and 78 return to their normally nonconductive states.

Output voltage limit transistor 90 includes a base electrode connected to the base electrode of transistor 80, a collector electrode connected to junction 92 and an emitter electrode connected through resistor 94 to power supply conductor 40. Resistor 96 is connected between junction 92 and output terminal 28. Consequently, since the base electrodes of transistors 80 and 90 are coupled together, transistor 90 can be rendered fully conductive in response to the base drive that renders transistor 80 fully conductive to pull output terminal 28 to a voltage level which is less than one volt above the ground potential at conductor 40. Hence, transistor 90 enables regulator 10 to meet specifications requiring that the output voltage be less than one volt when the protection circuitry shuts down the voltage regulator by rendering transistor 80 conductive. Transistor 90 is connected through junction 92 and resistor 96 to output terminal 28 so that resistor 96 limits the maximum current conducted by transistor 90 to prevent damage of transistor 90 in the event transistor 90 is rendered conductive when output terminal 28 is at high voltage level.

It is well known that transistors, such as series pass output power transistor 12, have a safe operating area defined by a plot of maximum voltage versus maximum current. Generally, as the voltage across transistor 12 is increased to a critical magnitude, the collector and emitter currents of transistors 12 must be decreased to prevent destruction or permanent deterioration of the characteristics of transistor 12. Resistors 98, 99, 100, 102, 104, and 106, PNP transistors 108, 110 and zener diode 113 tend to insure that transistor 12 is operated within its safe area. More specifically, as the voltage between the emitter and collector electrodes of transistor 12 increases, the voltage across the series circuit of resistors 98, 99, 102, 104, zener 113, resistor 106 and resistor 96 also increases. The magnitude of the breakover voltage of zener diode 113 is chosen so that zener 113 becomes conductive as a critical collector-to-emitter voltage is reached thereby drawing base current from lateral PNP control transistor 108. Consequently, transistor 108 becomes conductive. The collector current from transistor 108 then tends to render control transistor 80 conductive. Consequently, base drive for driver transistor 22 and consequently for series pass transistor 12 is shunted through transistor 80 to conductor 40. Thus, if the emitter-to-collector voltage across series pass transistor 12 is increased above its safe level the output current of transistor 12 is decreased so that transistor 12 is kept within the safe area of operation.

PNP transistor 108 and 110 can be formed by a single dual collector transistor structure. PNP transistor 110 which includes an emitter electrode connected to the emitter electrode of transistor 108, a base electrode connected to the base electrode of transistor 108 and a collector electrode connected to junction 116 between resistors 104 and 102, prevents transistor 108 from latching up in a conductive mode after an overtemperature or overcurrent condition has been removed. Transistor 110 allows transistor 108 to become nonconductive in response to zener diode 113 going out of breakdown.

NPN transistor 112, resistors 98, 99, 100 and PNP transistor 108 are included in over current protection current control circuit 111 for NPN output power transistor 12. Current magnitude sense transistor 112 includes base and emitter electrodes respectively connected to the base and emitter electrodes of transistor 12. The emitter area of transistor 112 is chosen to be a predetermined fraction of or have a predetermined ratio to the emitter area of transistor 12. Since transistors 12 and 112 have the same base-to-emitter voltage, transistor 112 conducts instantaneous collector and emitter currents which are proportional to the instantaneous collector and emitter currents of protected transistor 12. The collector of transistor 112 is connected to sense resistor 98 which transforms the control collector current conducted by transistor 112 into a control voltage. Parallel sense resistor 98 is connected between the collector of transistor 112 and the collector of protected transistor 12. The control voltage is applied through resistor 99 to the base electrode of PNP transistor 108. The collector electrode of transistor 108 is connected to the base electrode of transistor 80.

In operation, before the magnitude of the current through the base-to-emitter junction of transistor 12 increases to an unsafe value, the collector current of transistor 112 causes a voltage across resistor 98 which renders conductive the high gain threshold circuit including transistor 108 and 80. Consequently, the base drive provided at output terminal 20 of control amplifier 80 is shunted away from the base electrode of driver transistor 22. As a result, transistors 22 and 12 are rendered less conductive. Also, transistor 90 can be activated to pull the output voltage at output terminal 28 to a desired low level. Hence, current protection is effectuated by the combination of transistor 112, resistor 98, transistor 108, and transistor 80.

Thus, the thermal current and the safe area protection functions of the embodiment shown for integrated circuit 10 of FIG. 1 utilize common components. Each protection function can be performed independently of the others by selecting only the components necessary for that function.

Current protection or control of some prior art configurations require a sense resistor to be connected between the emitter electrode of output transistor 12 and output terminal 28. Some of the disadvantages relating to such prior art circuits have been described in the foregoing BACKGROUND OF THE INVENTION. The protection circuits of the regulator of integrated circuit 10 do not require a series current sense resistor to be connected in series between output transistor 12 and output terminal 28. Consequently, the current protection circuit of integrated circuit 10 reduces the required power dissipation of output transistor 12 and minimizes the differential input-to-output voltage of the regulator as compared to the aforementioned prior art circuits.

Figure 2:
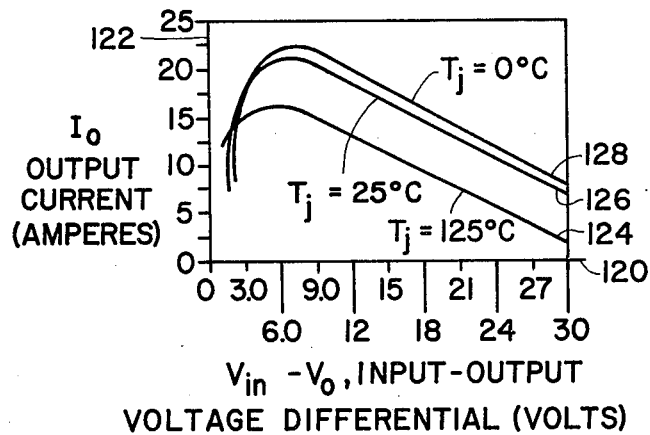
FIG. 2 is a graph of output current versus differential input-to-output voltage for a voltage regulator circuit.

More specifically, FIG. 2 is a graph showing required differential input-to-output (Vin-Vo) voltage, along abscissa 120, as a function of output current (Io) along ordinate axis 122 for the MC7800 series of voltage regulators. The family of curves 124, 126 and 128 indicate the required characteristic curves as a function of junction temperatures ($T_j$). The differential input-to-output voltages of the regulator of integrated circuit 10 can be measured between conductor 24 and output terminal 28. Clearly, the specification dictated by the curves of FIG. 2 is easier to meet by circuit 10 of FIG. 1 than it would be if the series sense resistor was required between the emitter electrode of transistor 12 and output terminal 28. Such a sense resistor would tend to increase the differential input-to-output voltage as the output current increased thereby causing otherwise acceptable regulators to be rejected during testing operations. Moreover, the size of transistor 12 can be reduced in integrated circuit 10 as compared to the aforementioned prior art circuit because transistor 12 doesn't have to drive and dissipate the heat generated by a series sense resistor.

Parallel sense resistor 98 only has to conduct a fraction 1/N of the current of a series sense resistor where N is the ratio of the emitter area of transistor 12 to the emitter area of transistor 112. Thus, since power and hence heat varies as the square of the current, the heat dissipation required for resistor 98 is 1/N2 the heat dissipation requirement of a series sense resistor. N is on the order of 100 in one commercial embodiment.

Figure 3:
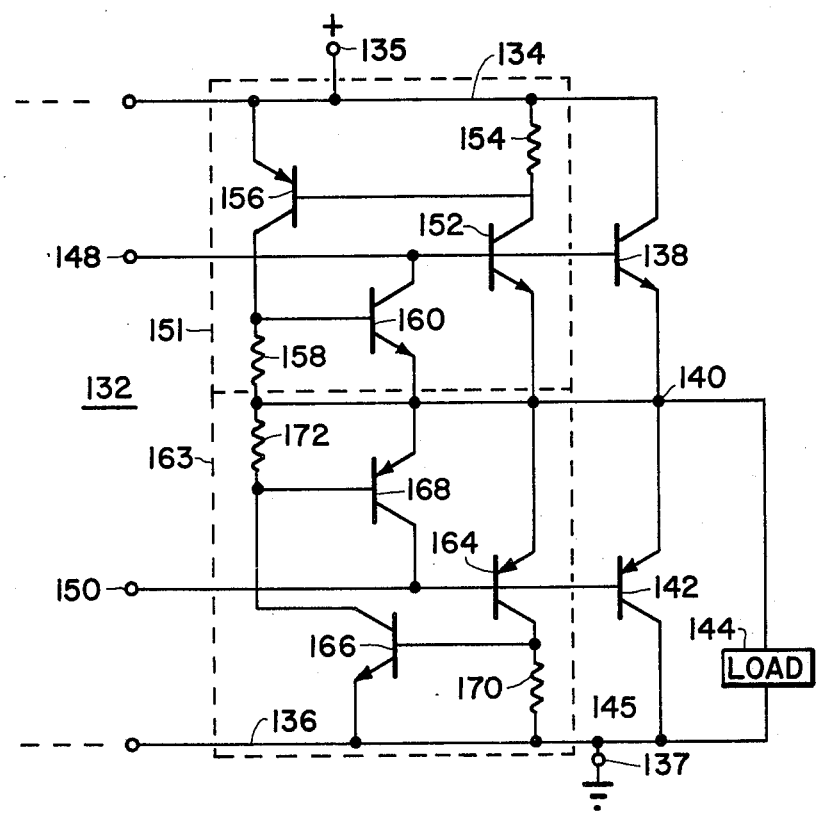
FIG. 3 is a schematic diagram of a complementary output stage including current control, protection circuits of another embodiment of the invention.

FIG. 3 is a schematic diagram illustrating the utilization of a current protection circuit of another embodiment of the invention, in amplifier 132 to prevent either or both of a pair of complementary output transistors from being damaged by excessive currents. Specifically, amplifier circuit 132, which is suitable for being included in monolithic integrated circuit form, includes respective positive and negative power supply conductors 134, 136 which adapted to be connected to respective positive and negative power supply terminals 135 and 137. NPN complementary power output transistor 138 includes a collector electrode connected to conductor 134 and an emitter electrode connected to output pinout terminal 140. Complementary output PNP transistor 142 includes an emitter electrode connected to pinout output terminal 140 and a collector electrode connected to conductor 136. External load 144 is connected between output terminal 140 an pinout 145. Transistor 138 is adapted to be rendered conductive by the positive portions of input signals applied to terminal 148, which is connected to the base electrode thereof. Alternatively, transistor 142 is rendered conductive in response to the negative portions of input signals applied to terminal 150, which is connected to the base electrode thereof. Hence, load 144 is driven in a push-pull manner.

Protection circuit 151 for transistor 138 includes current sense transistor 152, curent-to-voltage converting sense resistor 154, and a threshold crossing responsive circuit including PNP transistor 156, resistor 158, and NPN drive shunting transistor 160. Sense transistor 152 includes a base electrode which is connected to the base electrode of transistor 138 and an emitter electrode which is connected to the emitter electrode of transistor 138. The emitter area of transistor 152 is chosen to be 1/N of the area of transistor 138 so that transistor 152 conducts the instantaneous current of transistor 138 divided by N. Parallel sense resistor 154 is connected between the collector electrode of transistor 152 and conductor 134 and converts the current conducted by transistor 152 into a voltage for driving transistor 156, which includes an emitter electrode connected to conductor 134, a base electrode connected to resistor 154 and a collector electrode connected to the base electrode of transistor 160 and to resistor 158. Transistor 160 includes a collector electrode connected to the base electrodes of transistors 138 and 152 and an emitter electrode connected to output terminal 140. Transistors 156 and 160 are arranged to have sufficient voltage gain so that they are rendered conductive if the voltage across resistor 154 crosses a predetermined threshold in response to the magnitude of the current through transistor 138 exceeding a predetermined value. Thus, if output terminal 140 is shorted to ground, for instance, transistor 152 conducts sufficient current to produce a voltage across resistor 154 which renders transistor 156 conductive. As a result, transistor 160 is rendered conductive and removes or decreases the base drive to transistors 138 and 152 so that protected transistor 138 is not damaged.

Current protection circuit 163 for PNP output device 142 includes transistors 164, 166, 168 and resistors 170 and 172. Current sense transistor 164 includes emitter and base electrodes that are respectively connected to the emitter and base electrodes of transistor 142. The collector electrode of PNP transistor 164 is connected through resistor 170 to negative supply conductor 136. NPN transistor 166 includes a base electrode connected to resistor 170, an emitter electrode connected to conductor 136 and a collector electrode connected through resistor 172 to output terminal 140. Drive shunting PNP transistor 168 includes a base electrode connected to the collector electrode of transistor 166 and to resistor 172, an emitter electrode connected to output terminal 140 and a collector electrode connected to the base electrodes of transistors 142 and 164. Protection circuit 163 for transistor 142 operates in the manner similar to that previously described for circuit 151. Briefly, transistor 164 is arranged to conduct an instantaneous current that is proportional to the current of transistor 142. Sense resistor 170 converts the collector current of transistor 164 to a control voltage. The magnitude of this control voltage exceeds the threshold of the gain circuit of transistors 166 and 168 before transistor 142 conducts an excessive amount of current. Transistor 166 renders transistor 168 conductive to shunt the base drive for transistors 164 and 142 through load 144 to the ground or reference potential in response to the magnitude of the current through transistor 142 becoming too large.

Improved protection circuits for preventing the destruction of protected transistors 12, 138 and 142 have been described. The described current protection circuits 111, 151 and 163 are suitable for being combined with thermal shutdown and safe area protection circuits. Each of current shut down circuits 11, 151 and 163 generally includes a current sense transistor 112, 152 and 164 having an emitter area which can be fabricated to be a precise predetermined fraction of the emitter area of a protected device 12, 138, 142 if provided in integrated circuit form. Alternatively, if provided in discrete form then a discrete current sense transistor is selected which has an appropriate emitter area as compared to the emitter area of a protected transistor. Since the shunt sense resistor of the current control circuit conducts only a fraction of the current conducted by prior art series sense resistors, the increase in temperature contributed by shunt sense resistors is much less than the increase in temperature contributed by the series sense resistor of prior art circuits. Moreover, each shunt current sense resistor, such as resistors 98, 154 and 170, can be located in the integrated circuit at a point remote to the output transistors, such as transistors 12, 138 and 142, so that these output transistors do not have to be made larger to dissipate the heat created by the sense resistors. Moreover, since the shunt current sense resistors of current protection circuits 111, 151 and 163 are not in series with the output transistors, they do not load the output transistors. Thus, the size of the output transistors can be further minimized. In addition, since the shunt sense resistors are not connected in series with the emitters of the output transistors, the voltage across the sense resistors do not add to the differential input-to-output voltage. Hence, integrated circuit voltage regulators can be fabricated, which meet differential input-to-output voltage specifications which they would otherwise fail to meet, if a series sense resistor was connected in series between the input terminal and the output terminal of the regulator.

What is claimed:
1. A protection circuit for a protected transistor having emitter, base and collector electrodes, said emitter electrode being coupled to an output terminal, the protection circuit including in combination:
sense transistor means coupled to the protected transistor for providing a first control signal having a magnitude proportional to the magnitude of a signal conducted by the protected transistor, said sense transistor means having first, second and control electrodes;
sense resistive means for providing a second control signal in response to said first control signal, said sense resistive means being coupled to said sense transistor means;

first control transistor means for responding to said second control signal developed across said sense resistive means, said first control transistor means having first, control and second electrodes;

first circuit means coupling said first control transistor means to said sense resistive means;

second control transistor means for selectively shunting drive signals away from the protected transistor, said second control transistor means having first, control and second electrodes;

second circuit means coupling said second control transistor means to said first control transistor means and to the protected transistor; and voltage limiting transistor having a control electrode coupled to said control electrode of said second control transistor means, a first electrode coupled to a reference voltage conductor and a second electrode coupled to the output terminal, said voltage limiting transistor means being rendered conductive in response to said second control transistor means being rendered conductive to cause the voltage at the output terminal to be limited to a predetermined maximum magnitude.

2. The protection circuit of claim 1 wherein said first circuit means includes a further resistive means.

3. The protection circuit of claim 1 wherein the protected transistor and said sense transistor means are included in the same monolithic integrated circuit.

4. The protection circuit of claim 1 further including thermal shutdown circuit means coupled to said control electrode of said second control transistor means.

5. The protection circuit of claim 1 further including safe area protection means coupled to said control electrode of said first control transistor means.

6. The protection circuit of claim 1 wherein said second circuit means includes an additional transistor means.

7. A protection circuit for the output transistor of a regulator including a driver circuit for the output transistor, the output transistor having a particular conductivity type and main electrodes connected between first and second terminals of the regulator, the protection circuit including in combination:

sense transistor means of the same conductivity type as the output transistor for providing a control current having a magnitude proportional to the magnitude of an instantaneous current conducted by the output transistor, said sense transistor having an emitter electrode connected to the emitter electrode of the output transistor, a base electrode connected to the base electrode of the output transistor, and a collector electrode, said sense transistor having an emitter area which is a selected fraction of the emitter area of the output transistor;

sense resistive means for providing a control voltage having a magnitude that is proportional to the magnitude of said control current, said sense resistive means being connected to said collector electrode of said sense transistor means;

first control transistor means for responding to the control voltage developed across said sense resistive means, said first control transistor means having emitter, base and collector electrodes;

first circuit means coupling said base electrode of said first control transistor means to said sense resistive means;

second control transistor means for shunting drive signals away from the driver circuit of the output transistor, said second control transistor means having emitter, base and collector electrodes;

second circuit means coupling said base electrode of said second control transistor means to said first control transistor means and said collector electrode of said second control transistor means to the drive circuit of the output transistor;

said first and second control transistor means forming a threshold responsive circuit which responds to the magnitude of the control voltage across said sense resistive means reaching a predetermined maximum level by reducing the magnitude of the drive signal to said sense transistor means and to the output transistor; and output voltage limiting transistor coupled between an output electrode of the output transistor and the control electrode of said second control transistor means.

8. The protection circuit of claim 7 wherein said first circuit means includes a safe area protection circuit coupled between said control electrode of said first control transistors means and an output electrode of the output transistor.

9. The protection circuit of claim 7 wherein in the output transistor and said sense transistor means are included in the same monolithic integrated circuit.

10. The protection circuit of claim 7 further including thermal shutdown means connected to said base electrode of said second control transistor means.

* * * * *